(12) United States Patent
Hause et al.

(10) Patent No.: US 6,491,799 B1
(45) Date of Patent: Dec. 10, 2002

(54) METHOD FOR FORMING A THIN DIELECTRIC LAYER

(75) Inventors: Frederick N. Hause, Austin, TX (US); Karsten Wieczorek, Reichenberg-Boxdorf (DE); Manfred Horstmann, Dresden (DE)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/766,738

(22) Filed: Jan. 22, 2001

(51) Int. Cl.[7] .............................................. C23C 14/34
(52) U.S. Cl. ............................ 204/192.23; 204/192.12; 204/192.3; 204/192.37
(58) Field of Search ..................... 204/192.12, 192.23, 204/192.3, 192.37

(56) References Cited

U.S. PATENT DOCUMENTS 5,565,074 A * 10/1996 Qian et al. ............. 204/298.08
6,057,244 A   5/2000 Hausmann et al. .......... 438/710
6,068,784 A   5/2000 Collins et al. ................ 216/68
6,117,279 A * 9/2000 Smolanoff et al. ..... 204/192.12

OTHER PUBLICATIONS

Vossen et al. "Thin Film Processes", p. 61–62 (1978).*

* cited by examiner

Primary Examiner—Steven H. VerSteeg
(74) Attorney, Agent, or Firm—Williams, Morgan & Amerson

(57) ABSTRACT

The method disclosed herein comprises initially providing a tool comprised of a process chamber, a lid above the process chamber, an RF coil for assisting in generating a plasma in the chamber, a substrate support, and a power supply coupled to the substrate support. The method continues with the step of positioning a substrate in the tool adjacent the substrate support, introducing a noble gas into the chamber, and forming a layer of material above the substrate by sputtering the lid material by performing at least the following steps: applying approximately 200–300 watts of power to the RF coil at a frequency of approximately 400 KHz and applying approximately 20–60 watts of power to the substrate at a frequency of approximately 13.56 MHz.

44 Claims, 3 Drawing Sheets

METHOD FOR FORMING A THIN DIELECTRIC LAYER

BACKGROUND OF THE INVENTION

1. Field of the Invention

The present invention is generally directed to semiconductor devices, and, more particularly, to a method of making very thin dielectric layers for use in such devices.

2. Description of the Related Art

By way of background, an illustrative prior art transistor is depicted in FIG. 1. An illustrative semiconductor device 12 is formed above a surface 11 of a semiconducting substrate 10. The device 12 is formed within an active area 13 in the substrate 10 that is defined by the trench isolation 21. The illustrative semiconductor device 12 depicted in FIG. 1 is an NMOS transistor comprised of a gate insulation layer 16, a gate electrode 14, sidewall spacers 20 and source/drain regions 18. The various components of the illustrative transistor depicted in FIG. 1 may be formed by a variety of techniques, and they may be comprised of a variety of different materials.

In general, there is a constant drive to reduce the size of semiconductor devices and increase the operating speed of integrated circuit devices using such semiconductor devices. As feature sizes, e.g., channel length, decrease, other features of the transistor must also be decreased, or scaled down, e.g., the thickness of the gate insulation layer 16. Additionally, it is known that the drive current of the transistor, a parameter that determines how fast the device will operate, is inversely proportional to the thickness of the gate insulation layer 16. That is, all other things being equal, the thinner the gate insulation layer 16, the faster the device will operate. Thus, there is a desire for producing thinner gate insulation layers 16 of a sufficient quality to provide transistors with faster operating speeds. In many cases, the gate insulation layer 16 is comprised of silicon dioxide, although other insulating materials may also be used, e.g., an oxide, an oxynitride, silicon oxynitride, etc. Such layers have typically been formed by either a thermal oxidation process or a deposition process, such as a sputter deposition process, a chemical vapor deposition process, etc. However, currently available technology is limited in its ability to produce thin, high quality gate insulation layers 16 comprised of silicon dioxide. Additionally, there is a desire for a method and apparatus for forming very thin layers of material, e.g., silicon dioxide, as such layers may be used in several aspects of semiconductor processing, e.g., as gate insulation layers, in forming very thin sidewall spacers, etc.

The present invention is directed to a method that solves, or at least reduces, some or all of the aforementioned problems.

SUMMARY OF THE INVENTION

The present invention is directed to a method of forming very thin layers of dielectric materials in semiconductor manufacturing operations. In one illustrative embodiment, the method comprises providing a tool comprised of a process chamber, a lid above the process chamber, an RF coil for assisting in generating a plasma in the chamber, a substrate support, and a power supply coupled to the substrate support. The method continues with the step of positioning a substrate in the tool adjacent the substrate support and introducing a noble gas into the chamber. The method concludes with the step of forming a layer of material above the substrate by sputtering the lid material by performing at least the following steps: applying approximately 200–300 watts of power to the RF coil at a frequency of approximately 400 KHz and applying approximately 20–60 watts of power to the substrate at a frequency of approximately 13.56 MHz. In one particularly illustrative embodiment, the method disclosed herein is used to form a layer of silicon dioxide having a thickness ranging from approximately 7–10 Å at a rate of approximately 1 Å/second.

BRIEF DESCRIPTION OF THE DRAWINGS

The invention may be understood by reference to the following description taken in conjunction with the accompanying drawings, in which like reference numerals identify like elements, and in which.

Figure 1:
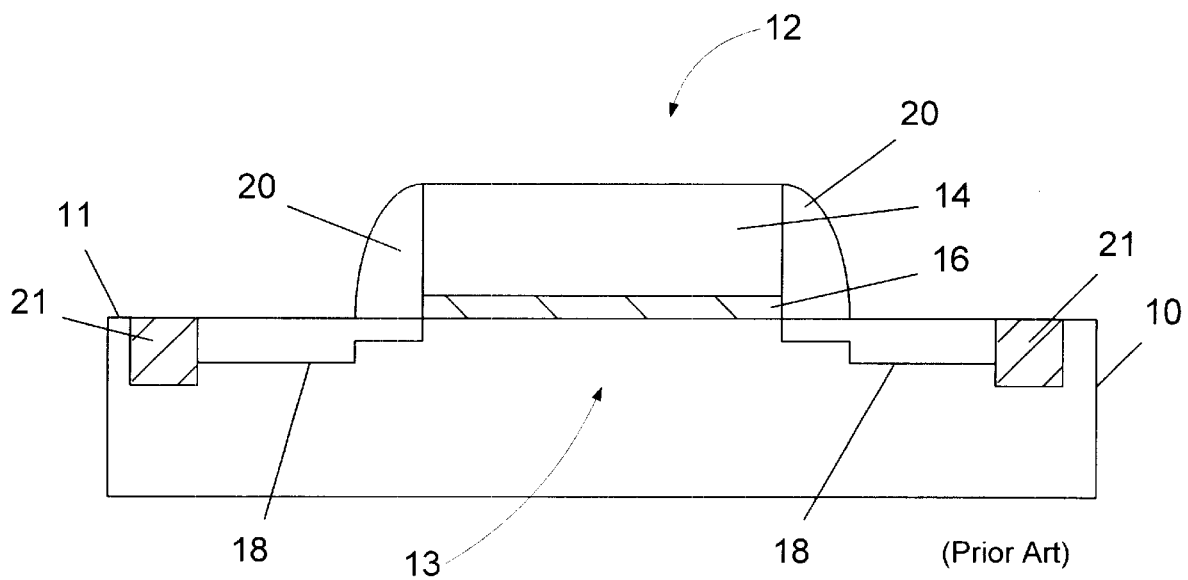
FIG. 1 is a cross-sectional view of an illustrative prior art semiconductor device formed above a semiconducting substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those features on fabricated devices. Nevertheless, the attached drawings are included to describe and explain illustrative examples of the present invention.

In general, the present invention is directed to a method of forming very thin layers of material, e.g., a thin dielectric layer to be used as a gate insulation layer in a transistor. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. Although the present invention is described with reference to a field effect transistor formed above a silicon substrate, the present invention may be applied to any kind of semiconductor device in which a gate structure is required, or in situations where there is otherwise a need for thin, high quality layers of dielectric material.

Figure 2:
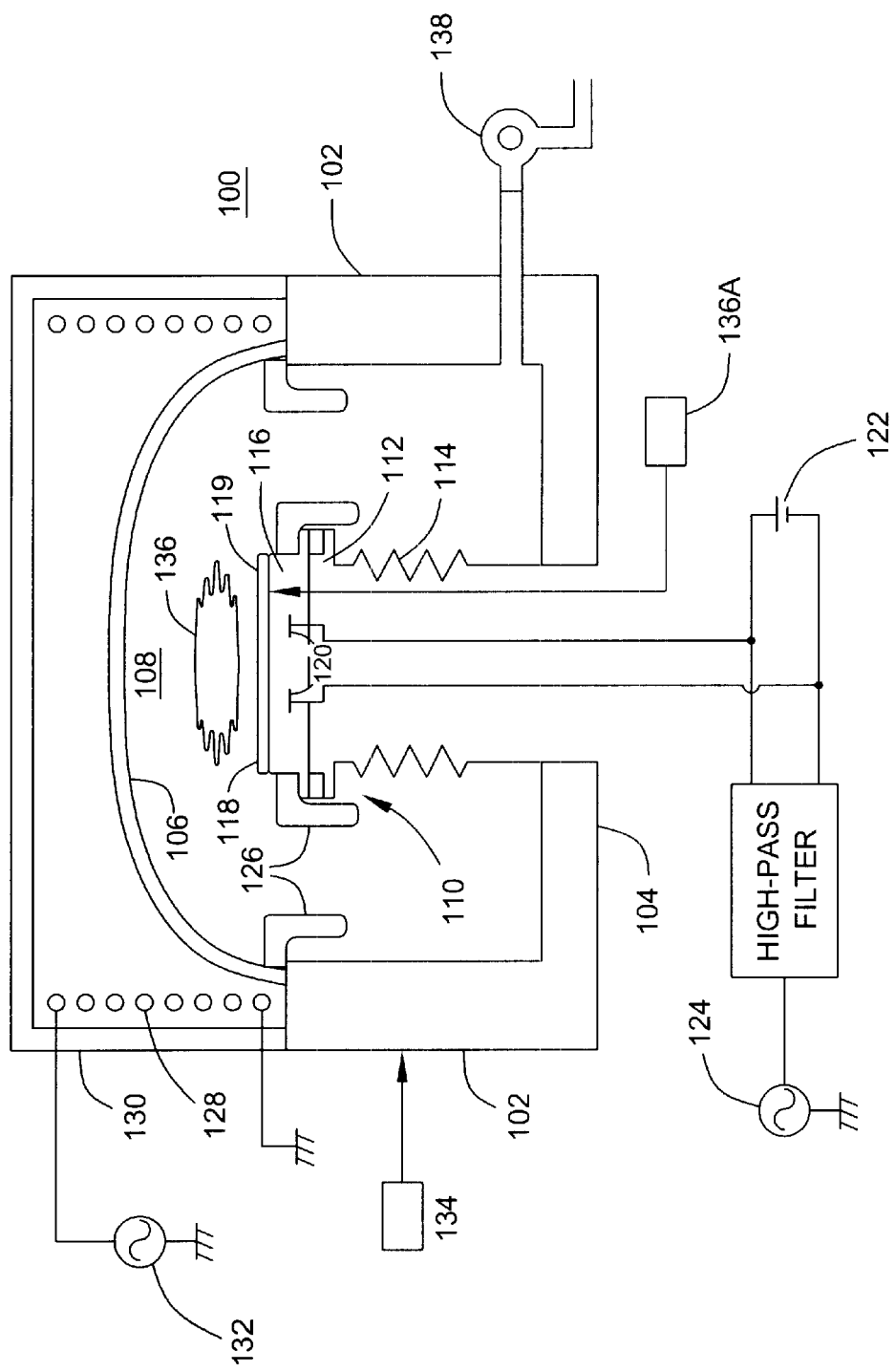
FIG. 2 is a cross-sectional view of an illustrative tool in which the present invention may be employed.

The present invention has been employed using a model PC II sputter etching tool manufactured by Applied Materials of Santa Clara, Calif. It is believed that U.S. Pat. No. 6,057,244 (the '244 patent), which is hereby incorporated by reference in its entirety, is descriptive of that tool. FIG. 2 of the present application is a copy of FIG. 1 from the '244 patent. As such, FIG. 2 is intended to be, at least in material respects, schematically descriptive of the Applied Materials tool used by the inventors to practice the method described herein.

Specifically, FIG. 2 depicts a schematic of a sputter etch process chamber 100 mentioned above. The chamber 100 comprises a plurality of walls 102 extending upwards from a base 104. A dome-shaped lid 106 encloses a process cavity 108 of the chamber 100. Within the cavity 108, a substrate support 110 is disposed for supporting and retaining a workpiece or substrate 118 such as a semiconductor wafer. The substrate support 110 further comprises a pedestal 112 sheathed in a bellows assembly 114. The bellows assembly 114 allows for movement of the substrate support 110 within the process cavity 108 while maintaining a vacuum condition within the enclosure 108. An electrostatic chuck 116 is disposed on top of the pedestal 112 for retaining the substrate 118 thereupon. The substrate 118 is electrostatically retained by the electrostatic chuck by the one or more electrodes 120 connected to a chucking power supply 122 (e.g., a high-powered DC source). Additionally, the substrate support 110 functions as an RF cathode via connection to an RF power supply 124. The chamber comprises one or more deposition shields, cover rings or the like 126 circumscribing various chamber components to prevent unwanted reaction between such components and ionized process material.

To create the desired plasma for processing the substrate 118, an RF coil 128 is provided in the chamber 100. Specifically, the coil 128 is disposed within a resonator housing 130 disposed above the lid 106. The coil 128 is vertically aligned with the walls 102 of the chamber 100 and is powered by an RF coil power source 132. Process gas (e.g., argon) is introduced into the chamber 100 from a process gas source 134. A plasma 136 is created in the process cavity 108 when the RF coil inductively couples power from source 132 to the process gas in the chamber. A backside gas is also provided through the substrate support 110 to a backside of the substrate 118 via a backside gas source 136A. The backside gas acts as a thermal conduction medium between the substrate support 110 and the substrate 118. To establish and maintain the necessary environmental conditions in the chamber 100, a pressure control device 138 is connected to the chamber 100. The pressure control device is, for example, a turbo pump or other similar pump capable of establishing near vacuum conditions (i.e., chamber pressure in the mTorr range).

The present invention is directed to forming a thin layer of dielectric material above a surface 119 of the substrate 118. The present invention may be used to form thin layers of, for example, silicon dioxide. Using the present invention, applicants have successfully formed a layer of silicon dioxide having a thickness of approximately 7–10 Å. Such a layer of silicon dioxide is useful as, among other things, a gate insulation layer in transistor devices. Such thin layers of dielectric material may also be used in other areas of semiconductor processing, such as forming thin dielectric spacers, etc.

The lid 106 is, in one embodiment, comprised of quartz or silica glass. As described more fully below, the lid 106 will serve the function of a target in the specific deposition process described below. Although the shape of the lid 106 in the Applied Materials tool described herein has proven to be successful, it is believed that the shape of the lid 106, or other components that serve the function of the lid 106, may be varied. For example, in lieu of the configuration of the lid 106 depicted in FIG. 2, the present invention may be employed in a process tool similar to the one depicted in U.S. Pat. No. 6,068,784, which is hereby incorporated by reference in its entirety.

The present invention makes use of a tool, normally configured for sputter etching, in a deposition process. This is in contrast to the deposition process whereby the resulting layer is a result of the constituent gases used to form the layer. For example, see col. 10, 11. 55–58, of the above-referenced U.S. Pat. No. 6,068,784 wherein a layer of silicon dioxide is formed by use of a silicon-containing gas such as silane ($SiH_4$).

In the disclosed embodiment, the RF power source 132 is used as a 400 kHz supply to RF coil 128, and the RF power source 124 is used as a 13.56 MHz supply to the substrate support 110. In normal operation, the 400 kHz power source 132 helps to strike a plasma within the chamber, and the 13.56 MHz supply generates a bias voltage and directs ions from the plasma directly toward the substrate 118 for sputter etching of a process layer (not shown) previously formed above the substrate 118. However, pursuant to the present invention, the conditions of the supply voltages 132, 124 are modified to keep the generated plasma at the periphery of the chamber 108, thereby causing sputtering or erosion of the lid 106. The supply voltage 124 to the workpiece 118 may also be varied to direct the sputtered atoms from the lid 106 onto the surface 119 of the substrate 118, thus depositing a layer of silicon dioxide ($SiO_2$) (not shown) on the substrate 118. This process, if carried out a substantial number of times in a given machine, will slowly erode the lid 106, and the lid 106 or other target will eventually require replacement. However, because of the rate at which this erosion occurs, such replacement will not be required very often.

With respect to more particular process parameters, in one illustrative embodiment, approximately 200–300 watts of power at a frequency of approximately 400 KHz may be supplied to the RF coil 128, and approximately 20–60 watts of power at a frequency of approximately 13.56 MHz may be supplied to the substrate 118. That is, the ratio of the power applied to the RF coil 128 to the power applied to the substrate support 110 may range from approximately 3.3–15. Stated another way, approximately 0.15–0.23 watts/$cm^2$ of said substrate at a frequency of approximately 400 KHz is supplied, and approximately 0.015–0.046 watts/$cm^2$ of said substrate at a frequency of approximately 13.56 MHz is supplied to the substrate 118. The process may be carried out with the chamber at a pressure ranging from approximately 2–20 MTorr. In one particularly illustrative embodiment of the present invention, approximately 250 watts of power (at approximately 400 KHz) is supplied to the RF coil 128, approximately 40 watts of power (at approximately 13.56 MHz) is supplied to the substrate 118 via the support 110, and the process is performed at a pressure ranging from approximately 2–20 Mtorr, and argon is supplied to the chamber 108 at a flow rate of approximately 2–10 sccm. Of course, other noble gases may be used with the present invention.

Figure 3:
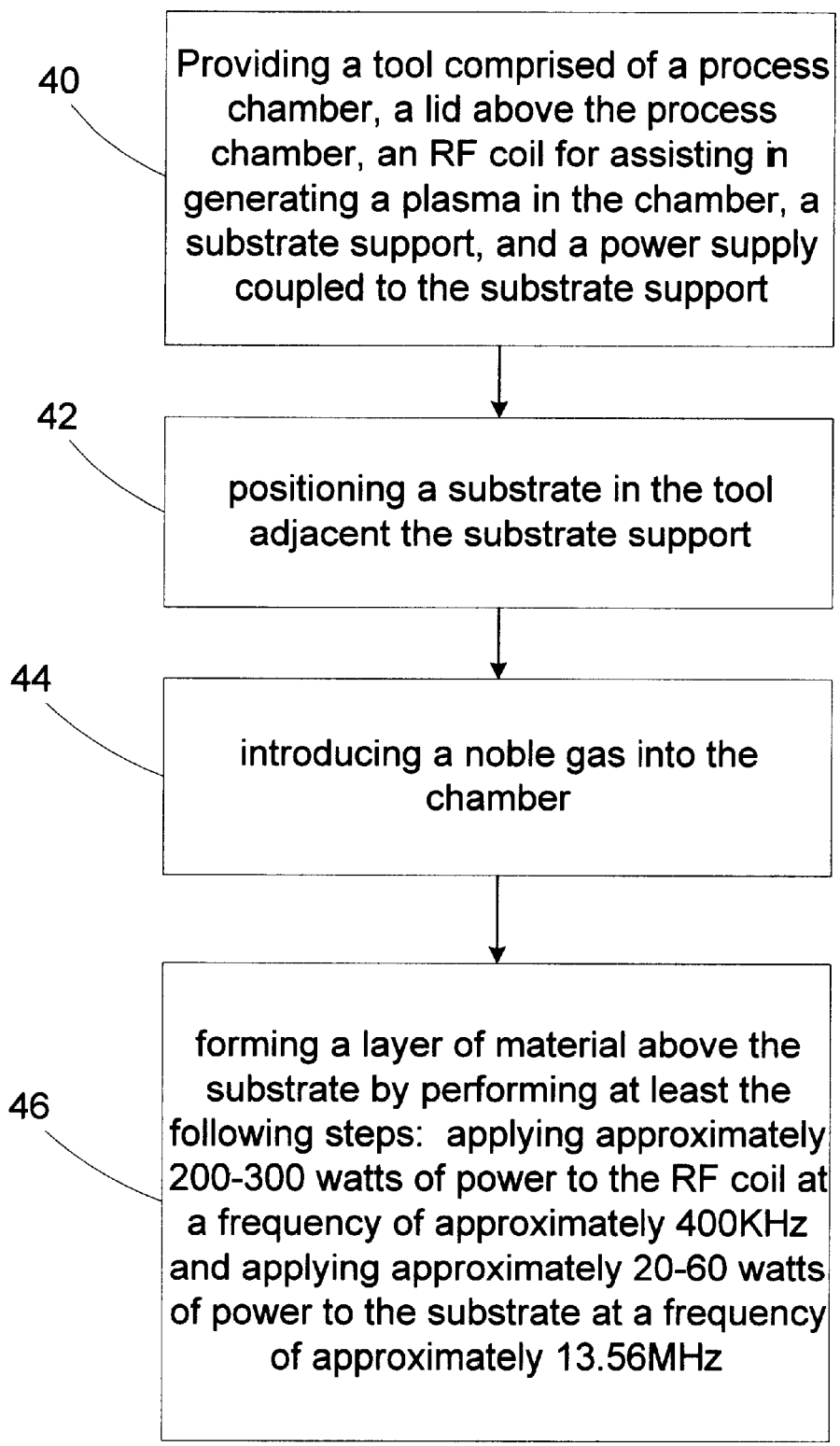
FIG. 3 is a flowchart depicting one illustrative embodiment of the present invention.

FIG. 3 depicts one illustrative embodiment of the present invention in flowchart form. As shown therein, the method comprises providing a tool comprised of a process chamber, a lid above the process chamber, an RF coil for assisting in generating a plasma in the chamber, a substrate support, and a power supply coupled to the substrate support, as recited at block 40. The method continues with the step of positioning a substrate in the tool adjacent the substrate support, as set forth at block 42, and introducing a noble gas into the chamber, as described at block 44. The method concludes with the step of forming a layer of material above the substrate by sputtering the lid material by performing at least the following steps: applying approximately 200–300 watts of power to the RF coil at a frequency of approximately 400 KHz and applying approximately 20–60 watts of power to the substrate at a frequency of approximately 13.56 MHz, as set forth at block 46.

Through use of the present invention, very thin, e.g., on the order of 7–10 Å, layers of dielectric material, e.g, silicon dioxide, may be formed. The method described above results in a nominal deposition rate of approximately 1 Å/second of silicon dioxide. This very slow deposition rate is in contrast to most deposition systems and process which are designed to achieve deposition rates on the order of approximately 1000 Å/minute. Moreover, through use of the present invention, unlike conventional sputter deposition, cooling of the lid 106 "target" may not be required.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a tool comprised of a process chamber, a lid comprised of a material positioned above said process chamber, an RF coil for assisting in generating a plasma in said chamber, a substrate support, a power supply coupled to said RF coil, and a power supply coupled to said substrate support;
   positioning a substrate in said tool adjacent said substrate support;
   introducing a noble gas into said chamber;
   forming a layer of material above said substrate by sputtering said lid material by performing at least the following steps:
      applying 200–300 watts of power to said RF coil at a frequency of approximately 400 KHz; and
      applying 20–60 watts of power to said substrate support at a frequency of approximately 13.56 MHz.

2. The method of claim 1, wherein said lid is comprised of at least one of quartz and silica.

3. The method of claim 1, wherein said power supply to said RF coil and said power supply to said substrate support are separate power supplies.

4. The method of claim 1, wherein positioning a substrate in said tool adjacent said substrate support comprises positioning a substrate comprised of silicon in said tool adjacent said substrate support.

5. The method of claim 1, wherein introducing a noble gas into said chamber comprises introducing a noble gas comprised of argon into said chamber.

6. The method of claim 1, wherein introducing a noble gas into said chamber comprises introducing a noble gas comprised of argon at a flow rate of approximately 2–10 sccm into said chamber.

7. The method of claim 1, wherein forming a layer of material comprises forming a layer of material comprised of silicon dioxide.

8. The method of claim 1, wherein said lid is comprised of at least one of quartz and silica glass, and forming a layer of material comprises forming a layer of material comprised of silicon dioxide at a rate of approximately 1 Å/second.

9. The method of claim 1, wherein said lid is comprised of at least one of quartz and silica glass, and forming a layer of material comprises forming a layer of material comprised of silicon dioxide having a thickness ranging from approximately 7–10 Å.

10. The method of claim 1, wherein said tool is a sputter etch tool.

11. A method, comprising:
    providing a tool comprised of a process chamber, a lid comprised of a material positioned above said process chamber, an RF coil for assisting in generating a plasma in said chamber, a substrate support, and a single power supply coupled to said RF coil and to said substrate support;
    positioning a substrate in said tool adjacent said substrate support;
    introducing a noble gas into said chamber;
    forming a layer of material above said substrate by sputtering said lid material by performing at least the following steps:
       applying approximately 0.15–0.23 watts/cm$^2$ of power to said RF coil at a frequency of approximately 400 KHz; and
       applying approximately 0.015–0.046 watts/cm$^2$ of power to said substrate support at a frequency of approximately 13.56 MHz.

12. A method, comprising:
    providing a tool comprised of a process chamber, a lid comprised of a material comprised of at least one of silica and quartz above said process chamber, an RF coil for assisting in generating a plasma in said chamber, a substrate support, a power supply coupled to said RF coil, and a power supply coupled to said substrate support;
    positioning a substrate in said tool adjacent said substrate support;
    introducing a noble gas into said chamber;
    forming a layer of silicon dioxide above said substrate by sputtering said lid material by performing at least the following steps:
       applying 200–300 watts of power to said RF coil at a frequency of approximately 400 KHz; and
       applying 20–60 watts of power to said substrate support at a frequency of approximately 13.56 MHz.

13. The method of claim 12, wherein said power supply to said RF coil and said power supply to said substrate support are separate power supplies.

14. The method of claim 12, wherein positioning a substrate in said tool adjacent said substrate support comprises positioning a substrate comprised of silicon in said tool adjacent said substrate support.

15. The method of claim 12, wherein introducing a noble gas into said chamber comprises introducing a noble gas comprised of argon into said chamber.

16. The method of claim 12, wherein introducing a noble gas into said chamber comprises introducing a noble gas comprised of argon at a flow rate of approximately 2–10 sccm into said chamber.

17. The method of claim 12, wherein forming said layer of silicon dioxide comprises forming a layer of silicon dioxide having a thickness ranging from approximately 7–10 Å at a rate of approximately 1 Å/second.

18. The method of claim 12, wherein said tool is a sputter etch tool.

19. A method, comprising:
providing a tool comprised of a process chamber, a lid comprised of a material positioned above said process chamber, an RF coil for assisting in generating a plasma in said chamber, a substrate support, a power supply coupled to said RF coil, and a power supply coupled to said substrate support;
positioning a substrate in said tool adjacent said substrate support;
introducing a noble gas into said chamber;
forming a layer of material above said substrate by sputtering said lid material by performing at least the following steps:
applying power at a first wattage to said RF coil at a frequency of approximately 400 KHz; and
applying power at a second wattage to said substrate support at a frequency of approximately 13.56 MHz, the ratio of the first wattage to the second wattage ranging from 3.3 to 15.

20. A method comprising:
providing a tool comprised of a process chamber, a lid comprised of a material positioned above said process chamber, an RF coil for assisting in generating a plasma in said chamber, a substrate support, a power supply coupled to said RF coil, and a power supply coupled to said substrate support;
positioning a substrate in said tool adjacent said substrate support;
introducing a noble gas into said chamber;
forming a layer of material above said substrate by sputtering said lid material by performing at least the following steps:
applying 0.15–0.23 watts/cm$^2$ of power to said RF coil at a frequency of approximately 400 KHz; and
applying 0.015–0.046 watts/cm$^2$ of power to said substrate support at a frequency of approximately 13.56 MHz.

21. The method of claim 20, wherein said lid is comprised of at least one of quartz and silica.

22. The method of claim 20, wherein said power supply to said RF coil and said power supply to said substrate support are separate power supplies.

23. The method of claim 20, wherein positioning a substrate in said tool adjacent said substrate support comprises positioning a substrate comprised of silicon in said tool adjacent said substrate support.

24. The method of claim 20, wherein introducing a noble gas into said chamber comprises introducing a noble gas comprised of argon into said chamber.

25. The method of claim 20, wherein introducing a noble gas into said chamber comprises introducing a noble gas comprised of argon at a flow rate of approximately 2–10 sccm into said chamber.

26. The method of claim 20, wherein forming a layer of material comprises forming a layer of material comprised of silicon dioxide.

27. The method of claim 20, wherein said lid is comprised of at least one of quartz and silica glass, and forming a layer of material comprises forming a layer of material comprised of silicon dioxide at a rate of approximately 1 Å/second.

28. The method of claim 20, wherein said lid is comprised of at least one of quartz and silica glass, and forming a layer of material comprises forming a layer of material comprised of silicon dioxide having a thickness ranging from approximately 7–10 Å.

29. The method of claim 20, wherein said tool is a sputter etch tool.

30. A method, comprising:
providing a tool comprised of a process chamber, a lid comprised of a material positioned above said process chamber, an RF coil for assisting in generating a plasma in said chamber, a substrate support, and a single power supply coupled to said RF coil and to said substrate support;
positioning a substrate in said tool adjacent said substrate support;
introducing a noble gas into said chamber;
forming a layer of material above said substrate by sputtering said lid material by performing at least the following steps:
applying approximately 200–300 watts of power to said RF coil at a frequency of approximately 400 KHz; and
applying approximately 20–60 watts of power to said substrate support at a frequency of approximately 13.56 MHz.

31. The method of claim 30, wherein said lid is comprised of at least one of quartz and silica.

32. The method of claim 30, wherein positioning a substrate in said tool adjacent said substrate support comprises positioning a substrate comprised of silicon in said tool adjacent said substrate support.

33. The method of claim 30, wherein introducing a noble gas into said chamber comprises introducing a noble gas comprised of argon into said chamber.

34. The method of claim 30, wherein introducing a noble gas into said chamber comprises introducing a noble gas comprised of argon at a flow rate of approximately 2–10 sccm into said chamber.

35. The method of claim 30, wherein forming a layer of material comprises forming a layer of material comprised of silicon dioxide.

36. The method of claim 30, wherein said lid is comprised of at least one of quartz and silica glass, and forming a layer of material comprises forming a layer of material comprised of silicon dioxide at a rate of approximately 1 Å/second.

37. The method of claim 30, wherein said lid is comprised of at least one of quartz and silica glass, and forming a layer of material comprises forming a layer of material comprised of silicon dioxide having a thickness ranging from approximately 7–10 Å.

38. The method of claim 30, wherein said tool is a sputter etch tool.

39. A method, comprising:
providing a tool comprised of a process chamber, a lid comprised of a material comprised of at least one of silica and quartz above said process chamber, an RF coil for assisting in generating a plasma in said chamber, a substrate support, and a single power supply coupled to said RF coil and to said substrate support;

positioning a substrate in said tool adjacent said substrate support;

introducing a noble gas into said chamber;

forming a layer of silicon dioxide above said substrate by sputtering said lid material by performing at least the following steps:

applying approximately 200–300 watts of power to said RF coil at a frequency of approximately 400 KHz; and applying approximately 20–60 watts of power to said substrate support at a frequency of approximately 13.56 MHz.

40. The method of claim 39, wherein positioning a substrate in said tool adjacent said substrate support comprises positioning a substrate comprised of silicon in said tool adjacent said substrate support.

41. The method of claim 39, wherein introducing a noble gas into said chamber comprises introducing a noble gas comprised of argon into said chamber.

42. The method of claim 39, wherein introducing a noble gas into said chamber comprises introducing a noble gas comprised of argon at a flow rate of approximately 2–10 scm into said chamber.

43. The method of claim 39, wherein forming said layer of silicon dioxide comprises forming a layer of silicon dioxide having a thickness ranging from approximately 7–10 Å at a rate of approximately 1 Å/second.

44. The method of claim 39, wherein said tool is a sputter etch tool.

* * * * *